(12) United States Patent
Briggs et al.

(10) Patent No.: US 10,943,866 B2
(45) Date of Patent: Mar. 9, 2021

(54) METHOD AND STRUCTURE TO CONSTRUCT CYLINDRICAL INTERCONNECTS TO REDUCE RESISTANCE

(71) Applicant: International Business Machines Corporation, Armonk, NY (US)

(72) Inventors: Benjamin D. Briggs, Waterford, NY (US); Michael Rizzolo, Delmar, NY (US); Christopher J. Penny, Saratoga Springs, NY (US); Huai Huang, Saratoga, NY (US); Lawrence A. Clevenger, Saratoga Springs, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/661,416

(22) Filed: Oct. 23, 2019

(65) Prior Publication Data

US 2020/0058591 A1 Feb. 20, 2020

Related U.S. Application Data

(62) Division of application No. 15/882,301, filed on Jan. 29, 2018, now Pat. No. 10,529,662.

(51) Int. Cl.
*H01L 23/528* (2006.01)
*H01L 23/522* (2006.01)
(Continued)

(52) U.S. Cl.
CPC .... *H01L 23/5283* (2013.01); *H01L 21/31056* (2013.01); *H01L 21/31111* (2013.01);
(Continued)

(58) Field of Classification Search
CPC .......... H01L 23/5283; H01L 21/32134; H01L 21/76882; H01L 21/76856;
(Continued)

(56) References Cited

U.S. PATENT DOCUMENTS 5,665,659 A 9/1997 Lee et al.
6,144,099 A * 11/2000 Lopatin ................ H01L 21/288
257/751
(Continued)

OTHER PUBLICATIONS

J. M. Roberts et al., "Resistivity of sub-30 nm Copper Lines," IEEE Interconnect Technology Conference and Materials for Advanced Metallization Conference (IITC/MAM), 2015, pp. 341-344.
(Continued)

*Primary Examiner* — Earl N Taylor
(74) *Attorney, Agent, or Firm* — James Nock; Ryan, Mason & Lewis, LLP (57) ABSTRACT

A method for manufacturing a semiconductor device includes forming a plurality of trenches in a dielectric layer, wherein the plurality of trenches each comprise a rounded surface, depositing a liner layer on the rounded surface of each of plurality of trenches, and depositing a conductive layer on the liner layer in each of the plurality of trenches, wherein the conductive layer and the liner layer form a plurality of interconnects, and each of the plurality of interconnects has a cylindrical shape.

20 Claims, 10 Drawing Sheets

(51) Int. Cl.
*H01L 21/768* (2006.01)
*H01L 21/3105* (2006.01)
*H01L 21/311* (2006.01)
*H01L 21/3213* (2006.01)

(52) U.S. Cl.
CPC .. *H01L 21/31116* (2013.01); *H01L 21/32134* (2013.01); *H01L 21/7685* (2013.01); *H01L 21/76816* (2013.01); *H01L 21/76843* (2013.01); *H01L 21/76847* (2013.01); *H01L 21/76852* (2013.01); *H01L 21/76856* (2013.01); *H01L 21/76874* (2013.01); *H01L 21/76882* (2013.01); *H01L 23/5226* (2013.01)

(58) Field of Classification Search
CPC ......... H01L 21/76852; H01L 21/76847; H01L 21/31056; H01L 21/76843; H01L 23/5226; H01L 21/31111
See application file for complete search history.

(56) References Cited

U.S. PATENT DOCUMENTS

| | | | | |
|---|---|---|---|---|
| 6,156,646 | A | 12/2000 | Ishihara | |
| 6,232,230 | B1* | 5/2001 | Iacoponi | H01L 21/7681 257/E21.579 |
| 6,586,334 | B2* | 7/2003 | Jiang | H01L 21/76807 257/E21.579 |
| 6,661,054 | B1* | 12/2003 | Nakamura | H01L 29/0696 257/330 |
| 6,960,519 | B1* | 11/2005 | Dalton | H01L 21/76804 257/E21.578 |
| 7,291,557 | B2* | 11/2007 | Wan | H01L 21/7684 257/E21.583 |
| 7,348,672 | B2* | 3/2008 | Chen | H01L 21/76834 257/758 |
| 7,582,532 | B2* | 9/2009 | Han | H01L 29/4236 438/259 |
| 7,696,569 | B2* | 4/2010 | Fujimoto | H01L 29/1037 257/330 |
| 7,741,228 | B2* | 6/2010 | Ueki | H01L 23/53295 438/736 |
| 8,158,532 | B2* | 4/2012 | Mayer | C25D 7/123 438/754 |
| 8,470,191 | B2* | 6/2013 | Mayer | B23H 5/08 216/92 |
| 8,505,199 | B2* | 8/2013 | Kwon | H01L 21/6835 29/874 |
| 8,575,022 | B2* | 11/2013 | Chrisman | H01L 21/7684 438/633 |
| 8,927,442 | B1* | 1/2015 | Angyal | H01L 21/02126 438/786 |
| 8,940,634 | B2* | 1/2015 | Engel | H01L 21/76895 438/629 |
| 9,059,259 | B2* | 6/2015 | Liou | H01L 21/76883 |
| 9,183,977 | B2* | 11/2015 | Menath | H01L 21/76816 |
| 9,368,362 | B2* | 6/2016 | Rha | H01L 23/53238 |
| 9,406,555 | B2* | 8/2016 | Deng | H01L 23/53238 |
| 9,412,646 | B2* | 8/2016 | Uzoh | H01L 21/76898 |
| 9,576,897 | B2* | 2/2017 | Deng | H01L 21/76849 |
| 9,711,453 | B2* | 7/2017 | Rha | H01L 21/76871 |
| 9,748,169 | B1* | 8/2017 | Murray | H01L 23/5329 |
| 9,780,027 | B2* | 10/2017 | Bergendahl | H01L 21/76834 |
| 9,780,161 | B2* | 10/2017 | Menath | H01F 17/02 |
| 9,953,924 | B2* | 4/2018 | Rha | H01L 21/02274 |
| 10,170,419 | B2* | 1/2019 | Adusumilli | H01L 21/76831 |
| 10,229,851 | B2* | 3/2019 | Briggs | H01L 21/321 |
| 10,269,712 | B2* | 4/2019 | Rha | H01L 21/76843 |
| 10,529,662 | B2* | 1/2020 | Briggs | H01L 21/76856 |
| 2002/0055256 | A1* | 5/2002 | Jiang | H01L 21/76807 438/687 |
| 2006/0194430 | A1* | 8/2006 | Beck | H01L 21/76844 438/627 |
| 2006/0214221 | A1* | 9/2006 | Challa | H01L 29/66734 257/328 |
| 2007/0031999 | A1* | 2/2007 | Ho | H01L 27/115 438/142 |
| 2007/0059502 | A1* | 3/2007 | Wang | C23C 14/046 428/209 |
| 2007/0190712 | A1* | 8/2007 | Lin | H01L 29/66621 438/197 |
| 2008/0079090 | A1* | 4/2008 | Hwang | H01L 23/5226 257/384 |
| 2008/0157194 | A1* | 7/2008 | Lee | H01L 21/82348 257/334 |
| 2008/0174027 | A1* | 7/2008 | Fang | H01L 23/53295 257/774 |
| 2008/0203455 | A1* | 8/2008 | Jang | H01L 27/10814 257/306 |
| 2009/0277867 | A1* | 11/2009 | Mayer | C25D 17/06 216/13 |
| 2009/0280649 | A1* | 11/2009 | Mayer | H01L 21/3212 438/676 |
| 2011/0097897 | A1* | 4/2011 | Tanaka | H01L 21/76876 438/653 |
| 2013/0001786 | A1* | 1/2013 | Engel | H01L 21/76895 257/761 |
| 2014/0138351 | A1* | 5/2014 | Mancarella | B81C 1/00071 216/37 |
| 2014/0332964 | A1* | 11/2014 | Yang | H01L 23/5329 257/762 |
| 2015/0021779 | A1* | 1/2015 | Liou | H01L 21/76883 257/773 |
| 2015/0037980 | A1* | 2/2015 | Rha | H01L 21/02274 438/700 |
| 2015/0348835 | A1* | 12/2015 | Deng | H01L 27/76849 257/751 |
| 2016/0293547 | A1* | 10/2016 | Rha | H01L 21/76871 |
| 2016/0307843 | A1* | 10/2016 | Deng | H01L 21/76879 |
| 2016/0365312 | A1* | 12/2016 | Basker | H01L 28/82 |
| 2017/0162448 | A1* | 6/2017 | Li | H01L 21/76895 |
| 2017/0278797 | A1* | 9/2017 | Rha | H01L 21/76832 |
| 2017/0373006 | A1* | 12/2017 | Adusumilli | H01L 21/76843 |
| 2018/0061708 | A1* | 3/2018 | Briggs | H01L 21/76834 |
| 2018/0145024 | A1* | 5/2018 | Christensen | H01L 23/5223 |
| 2018/0218980 | A1* | 8/2018 | Rha | H01L 21/7682 |
| 2019/0237402 | A1* | 8/2019 | Briggs | H01L 21/31116 |
| 2020/0058590 | A1* | 2/2020 | Briggs | H01L 21/31056 |
| 2020/0058591 | A1* | 2/2020 | Briggs | H01L 21/76882 |

OTHER PUBLICATIONS

IBM, "Copper Interconnect with TDDB Reliability Enhancement," IP.Com, IPCOM000161028D, Dec. 7, 2007, 7 pages.
List of IBM Patents or Patent Applications Treated as Related.

* cited by examiner

METHOD AND STRUCTURE TO CONSTRUCT CYLINDRICAL INTERCONNECTS TO REDUCE RESISTANCE

BACKGROUND

Metal resistivity has been known to increase in narrow trenches due to electron scattering from the surfaces in the trenches (also referred to as "surface scattering). As lines continue to narrow, the effects of electron scattering from surfaces significantly increase.

Beyond the 7 nm node, resistivity will be dominated by surface scattering over grain boundary and phonon scattering. For example, it is known that surface scattering can account for about 66% of the resistivity for 10 nm wide lines. As dimensions shrink, surface scattering will compose the majority of the wire resistivity. In other words, smaller dimensions will lead to increased surface scattering, which in turn will lead to increased resistance.

Accordingly, there is a need for viable methods to reduce surface scattering.

SUMMARY

According to an exemplary embodiment of the present invention, a method for manufacturing a semiconductor device includes forming a plurality of trenches in a dielectric layer, wherein the plurality of trenches each comprise a rounded surface, depositing a liner layer on the rounded surface of each of plurality of trenches, and depositing a conductive layer on the liner layer in each of the plurality of trenches, wherein the conductive layer and the liner layer form a plurality of interconnects, and each of the plurality of interconnects has a cylindrical shape.

According to an exemplary embodiment of the present invention, a semiconductor device includes a dielectric layer, a trench formed in the dielectric layer, a liner layer on surfaces of the trench, and a conductive layer on the liner layer in the trench, wherein the conductive layer and the liner layer form an interconnect having a cylindrical shape.

According to an exemplary embodiment of the present invention, a method for manufacturing a semiconductor device includes forming a trench in a dielectric layer, wherein the trench includes a rounded surface, and forming a conductive structure in the trench, wherein forming the conductive structure includes depositing a liner layer on the rounded surface of the trench, and depositing a conductive layer on the liner layer in the trench, wherein the conductive layer and the liner layer form the conductive structure, and the conductive structure has a cylindrical shape.

According to an exemplary embodiment of the present invention, a method for manufacturing a semiconductor device includes forming a trench in a dielectric layer, and forming a conductive structure in the trench, wherein forming the conductive structure comprises depositing a liner layer on a surface of the trench, wherein part of the liner layer is formed into a plurality of overhanging portions on a surface of the trench, and depositing a conductive layer on the liner layer in the trench, wherein the conductive layer and the liner layer form the conductive structure, and the conductive structure has a cylindrical shape.

According to an exemplary embodiment of the present invention, a semiconductor device includes a dielectric layer, a trench formed in the dielectric layer, and an interconnect formed in the trench, wherein the interconnect has a cylindrical shape.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to the formation of cylindrical interconnects to reduce resistivity.

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "height" refers to a vertical size of an element (e.g., a layer, trench, hole, opening, etc.) in the cross-sectional views or images measured from a bottom surface to a top surface of the element, and/or measured with respect to a surface on which the element is located. Conversely, a "depth" refers to a vertical size of an element (e.g., a layer, trench, hole, opening, etc.) in the cross-sectional views or images measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawings or images. For example, as used herein, "vertical" refers to a direction perpendicular to the top surface of the substrate in the cross-sectional views or images, and "horizontal" refers to a direction parallel to the top surface of the substrate in the cross-sectional views or images.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "round", "rounding" or "rounded" refers to a shape of an element which includes a surface in a circular or oval shape or other similar shape in which the surface of the element is curved into a continuous arc lacking angles and corners.

As used herein, "cylindrical" refers to an element in the shape of a cylinder having straight or approximately straight parallel sides and a circular or oval cross-section.

As noted above, as lines continue to narrow, the effects of electron scattering from surfaces significantly increase. According to an embodiment of the present invention, cylindrical interconnect lines instead of rectangular interconnect lines are used to reduce surface area and, thus, reduce the resistance. Cylindrical interconnects lead to lower surface area at the same interconnect (e.g., copper (Cu)) volume, which, in turn, leads to improved resistance (i.e., reduced resistivity). Cylindrical lines, in accordance with embodiments of the present invention, optimize the surface to area ratio and take advantage of the surface scattering component of the total resistivity, therefore reducing the total resistance.

Embodiments of the present invention also increase the maximum field ($E_{max}$) properties of the shortest break down path and decrease the minimum insulator requirement, therefore allowing larger line critical dimension (CD) and ultimately lower resistance.

In general, in a non-limiting illustrative example, the surface area of rectangular or square lines at a pitch of 20 nm at a given metal volume may be reduced by greater than 11% by using cylindrical lines, which also allows for smaller spacing between the lines. The reduced surface area decreases total resistivity. For example, in the case of 10 nm×10 nm square lines, the cylindrical lines at the same volume would experience an 11.2% reduction in surface area, and have 8.7 nm spacing between each line (each cylindrical line being 11.3 nm in diameter) instead of 10 nm between each square line. Since surface scattering is 66% of resistivity for 10 nm wide lines, the surface area reduction in this case decreases total resistivity by 7.4% (11.2*0.66).

Although embodiments of the present invention are discussed in connection with a tantalum or tantalum nitride liner layer, the embodiments of the present invention are not necessarily limited thereto, and can be applied with the same or similar results to thin film liner layers comprising other materials, such as, for example, titanium, tungsten, cobalt, ruthenium, iridium, nickel, rhodium and their nitrides, oxides, silicides or other alloy materials.

Figure 1A:
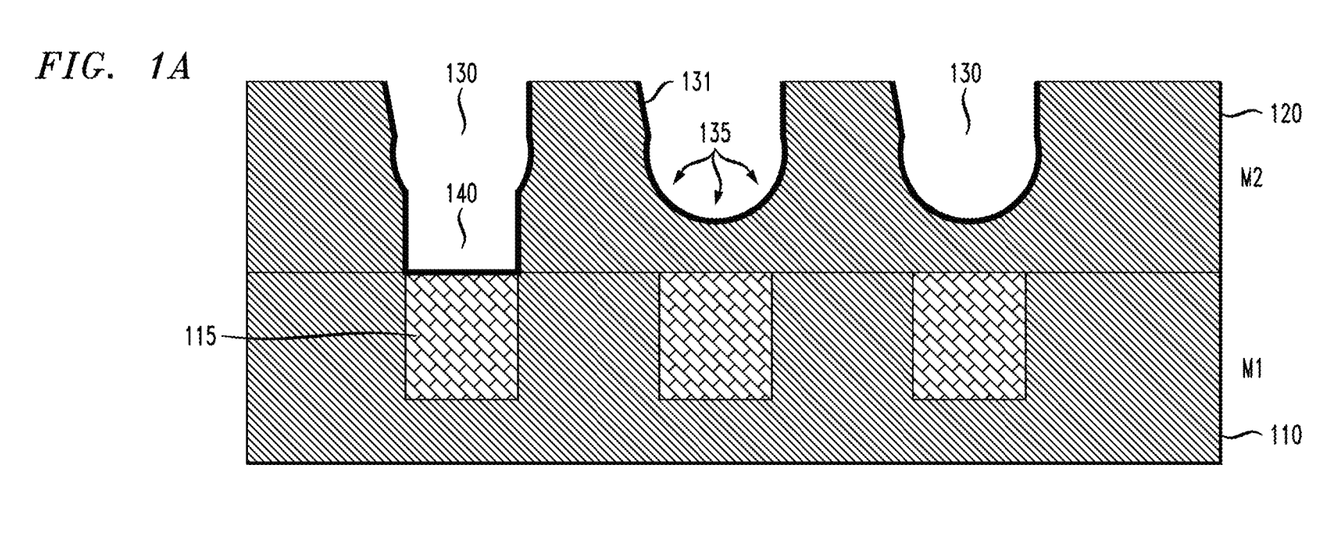
FIG. 1A is a cross-sectional view illustrating fabrication of a semiconductor device at a back-end-of-line (BEOL) or middle-of-line (MOL), and showing deposition of a liner layer to form openings having a rounded bottom surface in a dielectric, according to an exemplary embodiment of the present invention.

FIG. 1A is a cross-sectional view illustrating fabrication of a semiconductor device at a back-end-of-line (BEOL) or middle-of-line (MOL), and showing deposition of a liner layer to form openings having a rounded bottom surface in a dielectric, according to an exemplary embodiment of the present invention. Referring to FIG. 1A, one or more openings 130 (e.g., trenches) are formed in a dielectric layer 120, such as, for example, silicon dioxide ($SiO_2$), carbon-doped silicon oxide (SiCOH), SiLK® dielectrics, and porous forms of these low-k dielectric films. As an alternative to being formed through a single dielectric layer 120, the trenches 130 can be formed through a plurality of dielectric layers.

The trenches 130 can be defined using, for example, lithography techniques, and then an etch-back air-gap (EBAG) process including reactive ion etching (ME) using, for example, a carbon fluoride etchant such as, but not necessarily limited to, $CF_4$ or $CHF_3$, to open the trenches 130, which have a rounded bottom portion 135. The shape of the rounded bottom portion 135 can be varied by adjusting the RIE bias. For example, a lower bias ME is more isotropic than a higher bias ME, which leads to increased rounding of the trench bottom. In accordance with a non-limiting embodiment of the present invention, a radius of the rounded bottom portion can be in the range of about 2 nm to about 30 nm.

According to an embodiment, the dielectric 120 and the trenches 130 are part of a BEOL or MOL interconnect structure of an integrated circuit where devices, including, but not limited to, transistors, capacitors, and resistors are interconnected with metallization layers (e.g., wiring) on a wafer. For example, as shown in FIG. 1A, the trenches 130 can be filled with a conductive metal to form interconnect lines in a second metallization layer M2, which are electrically coupled to interconnect lines 115 formed in a dielectric 110 in a first metallization layer M1. Interconnect lines of the second metallization layer M2 are coupled to interconnect lines 115 of a first metallization layer M1 through vias 140.

As can be understood by one of ordinary skill in the art, the dielectric layers 110, 120 can be on a semiconductor substrate (not shown), with intervening layers between the dielectric layer 110 and the substrate. A semiconductor substrate can be, for example, a bulk substrate or a silicon-on-insulator (SOI) substrate including a buried insulating layer, such as, for example, a buried oxide or nitride layer located on an upper surface of the semiconductor substrate. The substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

A liner layer 131 comprising, for example tantalum and/or tantalum nitride, or other liner material(s), is formed to line the sidewall and bottom surfaces of the trenches 130, as well as sidewall and bottom surfaces of any vias 140 formed between metallization layers M1 and M2. Deposition is performed using atomic layer deposition (ALD), which preserves the rounded shape 135 at the bottom of each trench 130. Other deposition processes, such as, for example, sputtering, chemical vapor deposition (CVD) or physical vapor deposition (PVD) will not preserve the rounded shape, and will create a rectangular profile. A thickness of the liner layer 131 (e.g., height in the vertical direction and width in the horizontal direction) can be, but is not necessarily limited to, about 0.25 nm to about 5 nm.

Figure 1B:
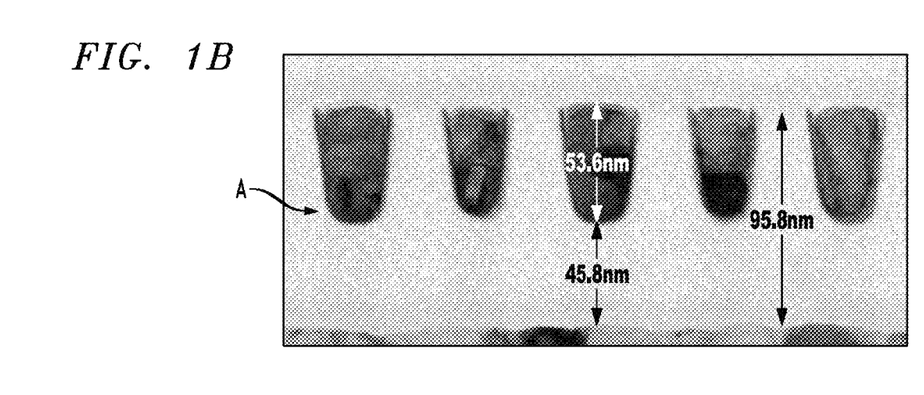
FIG. 1B is an image of openings having a rounded bottom surface in a dielectric, according to an exemplary embodiment of the present invention.

FIG. 1B is an image of openings having a rounded bottom surface in a dielectric, according to an exemplary embodiment of the present invention. Referring to FIG. 1B, the rounded surface A is formed at a bottom of trenches that are about 53.6 nm deep and about 45.8 nm from another metallization layer.

Figure 2:
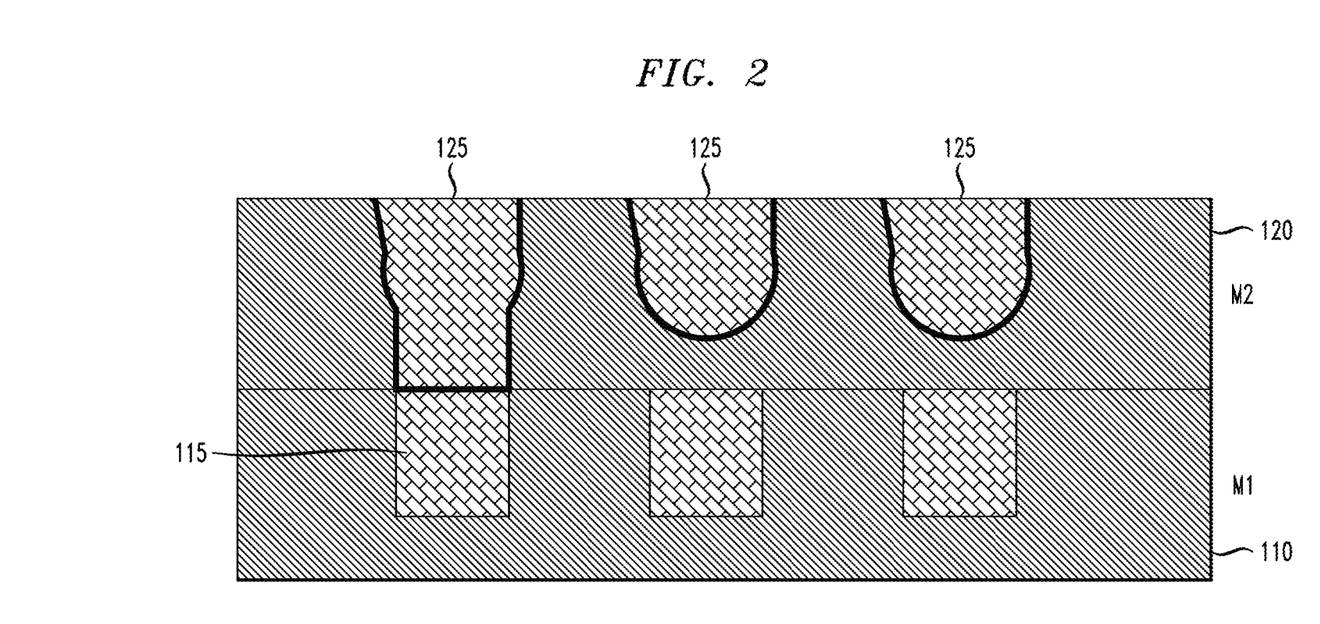
FIG. 2 is a cross-sectional view illustrating fabrication of a semiconductor device at a BEOL or MOL, and showing metal deposition and planarization, according to an exemplary embodiment of the present invention.

FIG. 2 is a cross-sectional view illustrating fabrication of a semiconductor device at a BEOL or MOL, and showing metal deposition and planarization, according to an exemplary embodiment of the present invention. Referring to FIG. 2, an electrically conductive layer 125 including, for example, copper (Cu), nickel (Ni), cobalt (Co), iron (Fe), gold (Au), silver (Ag), ruthenium (Ru), palladium (Pd), platinum (Pt), iridium (Ir), tungsten (W), and any mixtures or alloys thereof is deposited on the liner layer 131 using deposition techniques, including, but not necessarily limited to, electroplating, electroless plating, CVD and PVD techniques. The conductive layer 125 fills in the trenches 130 and vias 140 and is formed on the upper surface of the dielectric 120 to a height above the top surface of the dielectric 120. The conductive layer 125 and any excess liner layer 131 formed on the top surface of the dielectric 120 are polished off, using for example, a chemical mechanical planarization (CMP) process to planarize the top surface and result in structure shown in FIG. 2.

Figure 3A:
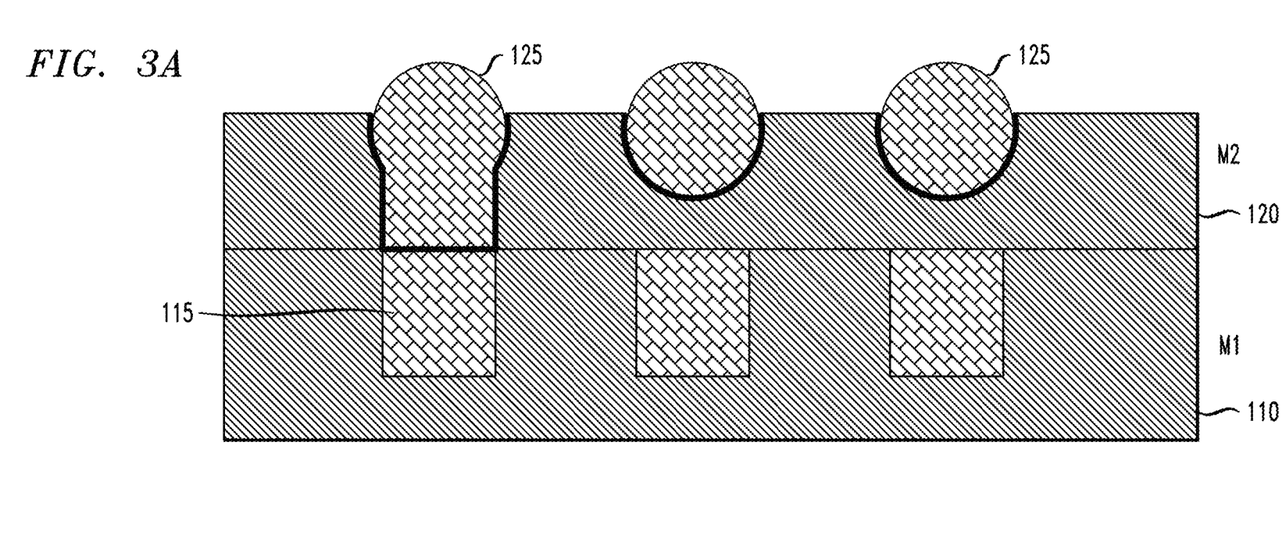
FIG. 3A is a cross-sectional view illustrating fabrication of a semiconductor device at a BEOL or MOL, and showing recessing of a dielectric layer and portions of the deposited liner and metal layers to form rounded top surfaces of the deposited metal, according to an exemplary embodiment of the present invention.
Figure 3B:
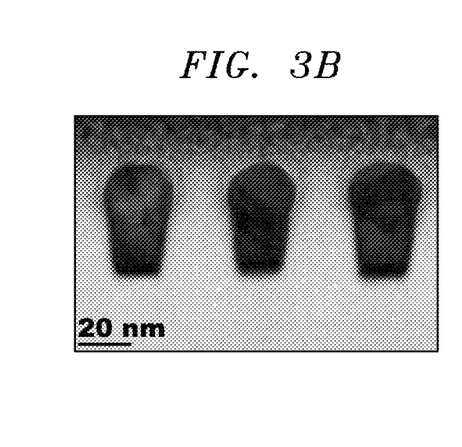
FIGS. 3B and 3C are images of metal layers having rounded top surfaces, according to an exemplary embodiment of the present invention.
Figure 3C:
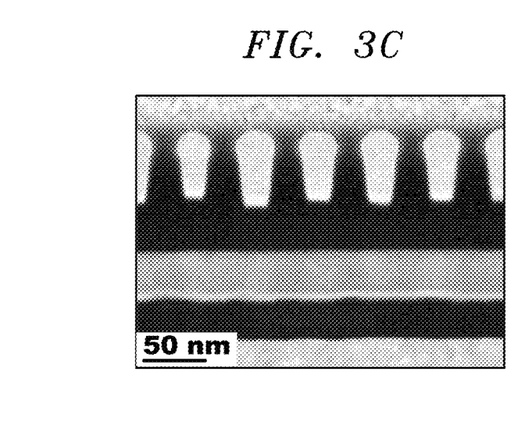

FIG. 3A is a cross-sectional view illustrating fabrication of a semiconductor device at a BEOL or MOL, and showing recessing of a dielectric layer and portions of the deposited liner and metal layers to form rounded top surfaces of the deposited metal, according to an exemplary embodiment of the present invention. Referring to FIG. 3A, the dielectric layer 120 and portions of the deposited liner and metal layers 131 and 125 are recessed to form rounded top surfaces of the deposited metal 125. In accordance with an embodiment of the present invention, an EBAG process using RIE bias and wet cleaning techniques is performed to recess the dielectric layer 120 and remove upper portions of the deposited liner and metal layers 131 and 125 to form rounded top surfaces of the deposited metal 125. Alternatively, a wet etching process is performed to remove upper portions of the metal and liner layers 125 and 131, and then a wet etch using, for example, hydrofluoric acid (HF) is performed to recess the dielectric layer 120 to result in the rounded top surfaces of the metal 125. FIGS. 3B and 3C are images of metal layers having rounded top surfaces, according to an exemplary embodiment of the present invention. The resulting metal lines formed from the metal and liner layers 125 and 131 are cylindrical in shape, and as shown, have a circular or oval cross-section.

Figure 4:
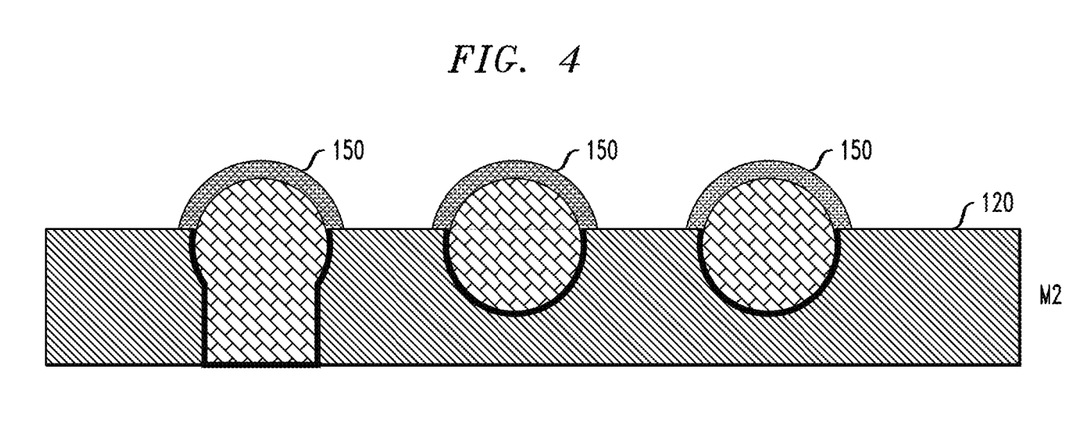
FIG. 4 is a cross-sectional view illustrating fabrication of a semiconductor device at a BEOL or MOL, and showing selective metal cap deposition on exposed rounded top surfaces of the deposited metal, according to an exemplary embodiment of the present invention.

FIG. 4 is a cross-sectional view illustrating fabrication of a semiconductor device at a BEOL or MOL, and showing selective metal cap deposition on exposed rounded top surfaces of the deposited metal, according to an exemplary embodiment of the present invention. Referring to FIG. 4, a metal cap layer 150 is selectively deposited on each of the exposed rounded top surfaces of the deposited metal 125. The selective metal cap deposition is performed using, for example, chemical vapor deposition (CVD), and results in the conformal cap 150 only on the exposed rounded top surfaces of the metal 125. The metal cap layer includes, but is not necessarily limited to, cobalt (Co) or ruthenium (Ru). In accordance with an embodiment of the present invention, the selective cap deposition can be combined with a nitridation process to form a plurality of diffusion barriers by converting the cap layers 150 to diffusion barriers. Depending on the material of the cap layer 150, the diffusion barriers may comprise, for example, cobalt nitride or ruthenium nitride.

Figure 5A:
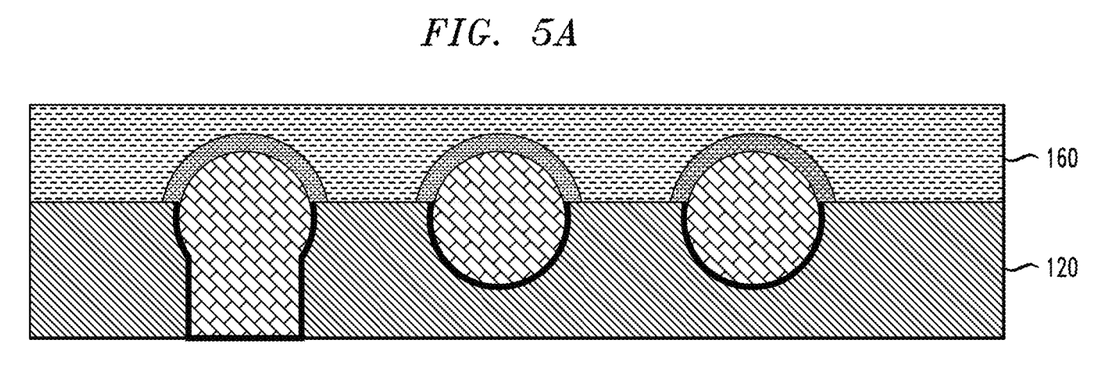
FIG. 5A is a cross-sectional view illustrating fabrication of a semiconductor device at a BEOL or MOL, and showing deposition of a conformal dielectric cap layer and planarization, according to an exemplary embodiment of the present invention.

FIG. 5A is a cross-sectional view illustrating fabrication of a semiconductor device at a BEOL or MOL, and showing deposition of a conformal dielectric cap layer and planarization, according to an exemplary embodiment of the present invention. Referring to FIG. 5A, a conformal dielectric cap layer 160 is deposited on the dielectric layer 120 and on the metal layers 125 including the conformal cap layers 150 thereon. The conformal dielectric cap layer 160 is then planarized, using, for example, CMP. The conformal dielectric cap layer 160 comprises, but is not necessarily limited to, silicon nitride (SiN) or silicon carbon nitride (SiCN), and may have a vertical height (e.g., thickness) in the range of about 1 nm to about 20 nm. The dielectric cap layer 160 can function as a diffusion barrier if the nitridation described above is not performed, and a next level dielectric layer (not shown) can be deposited on the dielectric cap layer 160.

Figure 5B:
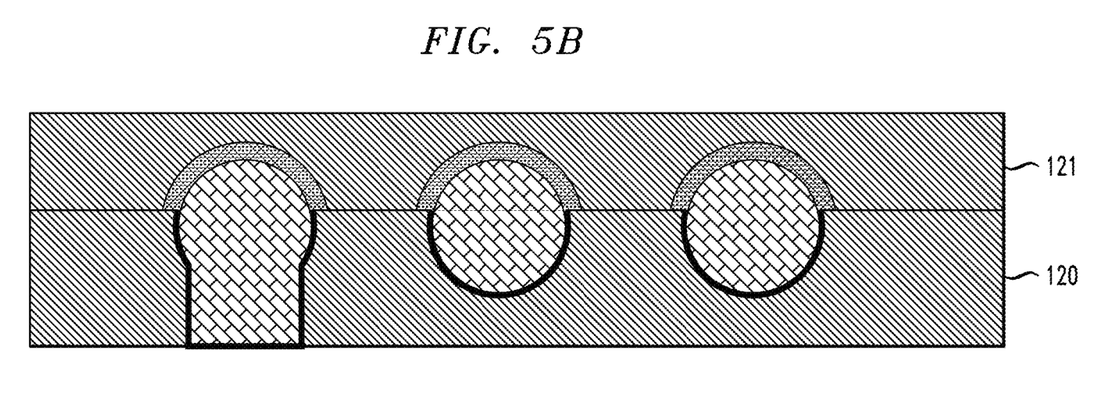
FIG. 5B is a cross-sectional view illustrating fabrication of a semiconductor device at a BEOL or MOL, and showing deposition of a low-K dielectric layer and planarization, according to an exemplary embodiment of the present invention.

FIG. 5B is a cross-sectional view illustrating fabrication of a semiconductor device at a BEOL or MOL, and showing deposition of a low-K dielectric layer and planarization, according to an exemplary embodiment of the present invention. Referring to FIG. 5B, a dielectric layer 121 is deposited on the dielectric layer 120 and on the metal layers 125 including the conformal cap layers 150 thereon. The dielectric layer 121 is then planarized, using, for example, CMP. The dielectric layer 121 comprises, but is not necessarily limited to, silicon dioxide ($SiO_2$), carbon-doped silicon oxide (SiCOH), SiLK® dielectrics, and porous forms of these low-k dielectric films. The dielectric layer 121 can function as a next level dielectric layer, and a dielectric cap layer like that described in FIG. 5A is not required if the nitridation described above is performed to form a diffusion barrier.

Figure 6:
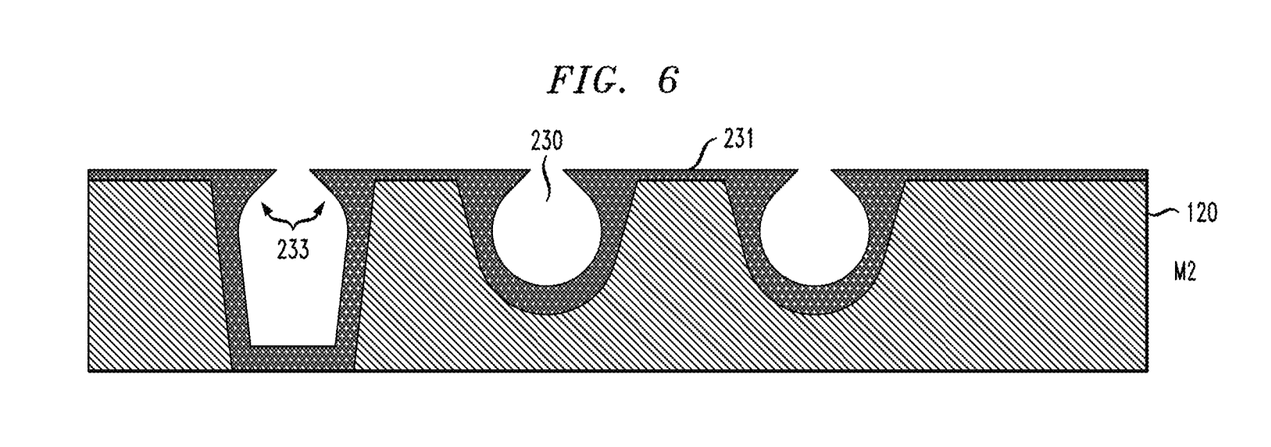
FIG. 6 is a cross-sectional view illustrating fabrication of a semiconductor device at a BEOL or MOL, and showing deposition of a liner layer using a low wafer bias to form an overhang, according to an exemplary embodiment of the present invention.

FIG. 6 is a cross-sectional view illustrating fabrication of a semiconductor device at a BEOL or MOL, and showing deposition of a liner layer using a low wafer bias to form an overhang, according to an exemplary embodiment of the present invention. Referring to FIG. 6, following the formation of trenches and vias as described herein above in connection with FIG. 1A, a liner material 231, such as, for example, tantalum nitride, is deposited on the dielectric layer 120 and in trenches 230 with a low wafer bias to intentionally leave overhanging portions 233, and preserve the rounded bottom shape of the trenches 230. In this case, the deposition can be performed using, for example, ALD or PVD since the rounded shape is preserved using low wafer bias, such as, but not necessarily limited to, 0 W to 500 W. The low wafer bias results in poor step coverage (e.g., more material deposited on top surfaces than on sidewalls and bottom surfaces, forming the overhanging portions 233) of the liner layer 231. In accordance with a non-limiting embodiment of the present invention, the thickness of the liner layer 231 is between about 0 angstroms and about 50 angstroms.

Figure 7:
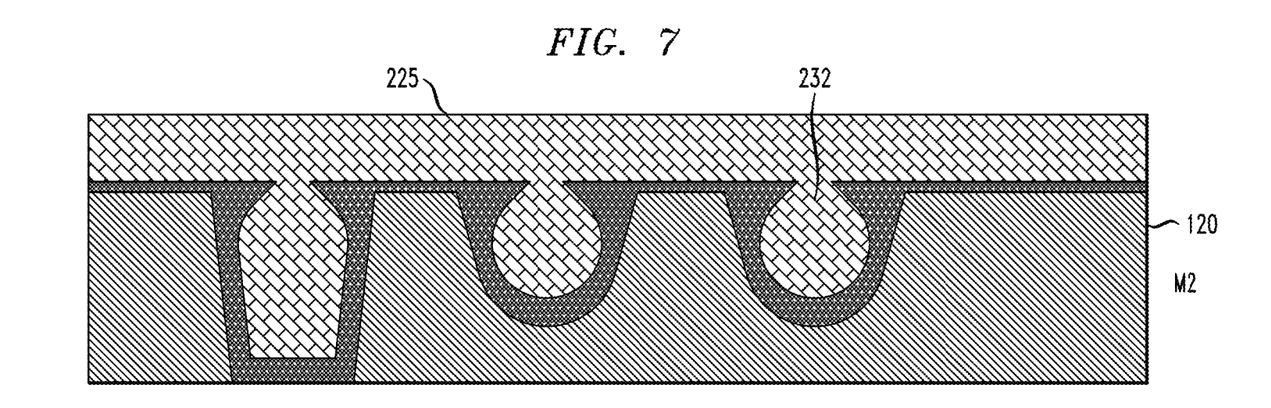
FIG. 7 is a cross-sectional view illustrating fabrication of a semiconductor device at a BEOL or MOL, and showing metal reflow into trenches, according to an exemplary embodiment of the present invention.
Figure 8:
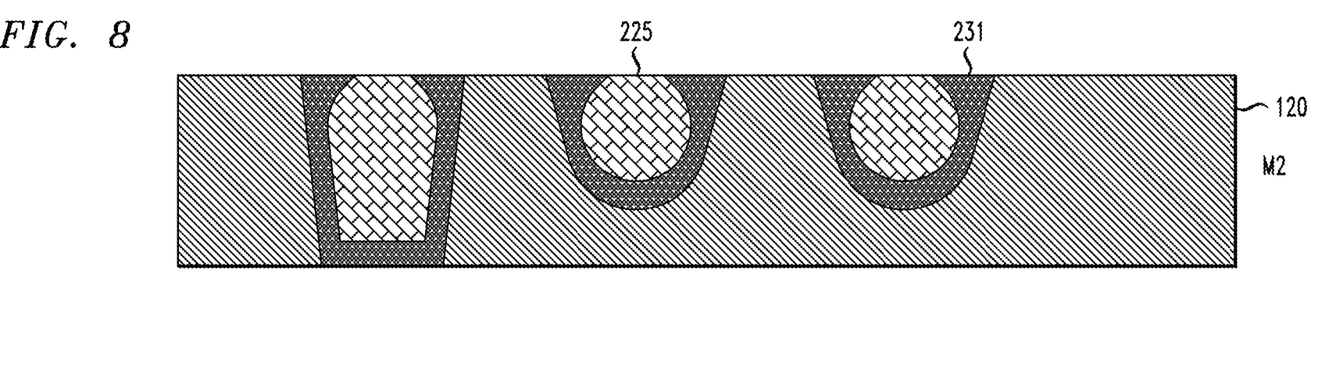
FIG. 8 is a cross-sectional view illustrating fabrication of a semiconductor device at a BEOL or MOL, and showing planarization, according to an exemplary embodiment of the present invention.

FIGS. 7 and 8 are cross-sectional views illustrating fabrication of a semiconductor device at a BEOL or MOL, and showing metal reflow into trenches and planarization, according to an exemplary embodiment of the present invention. Referring to FIG. 7, an electrically conductive layer 225 including, for example, copper (Cu), nickel (Ni), cobalt (Co), iron (Fe), gold (Au), silver (Ag), ruthenium (Ru), palladium (Pd), platinum (Pt), iridium (Ir), tungsten (W), and any mixtures or alloys thereof is deposited on the liner layer 231 and in the trenches 230 using a reflow deposition technique, where the layer 225 is deposited at an elevated temperature in a range of about 0° C. to about 500° C., so that the material of the layer 225 flows through the small openings 232 at the top of the trenches 230 caused by the overhanging portions 233. Due to the small openings 232, deposition by plating of the layer 225 is not effective to deposit the layer 225 through the openings 232 and fill in the trenches 230 and vias. Instead, capillary action during a reflow process permits the layer 225 to flow through the openings 232 into the trenches 230.

The conductive layer 225 fills in the trenches 230 and vias connecting the trenches to a next metallization level, and is also formed on the upper surface of the dielectric 120 and the deposited liner layer 231 to a height above the top surface of the dielectric 120. As shown in FIG. 8, the excess conductive layer 225 and liner layer 231 formed on the top surface of the dielectric 120 are polished off, using for example, a CMP process to planarize the top surface and result in structure shown in FIG. 8. As can be seen, due to the overhanging portions 233, the resulting top portions of the layer 225 in the trenches 230 have a rounded shape. As a result, processing to remove portions of the conductive layer to form the rounded top portions as described in connection with FIG. 3A may be eliminated or reduced since the round shape or majority of the round shape has already been formed due to the overhanging portions 233. The resulting metal lines formed from the metal and liner layers 225 and 231 are cylindrical in shape, and as shown, have a circular or oval cross-section.

Figure 9:
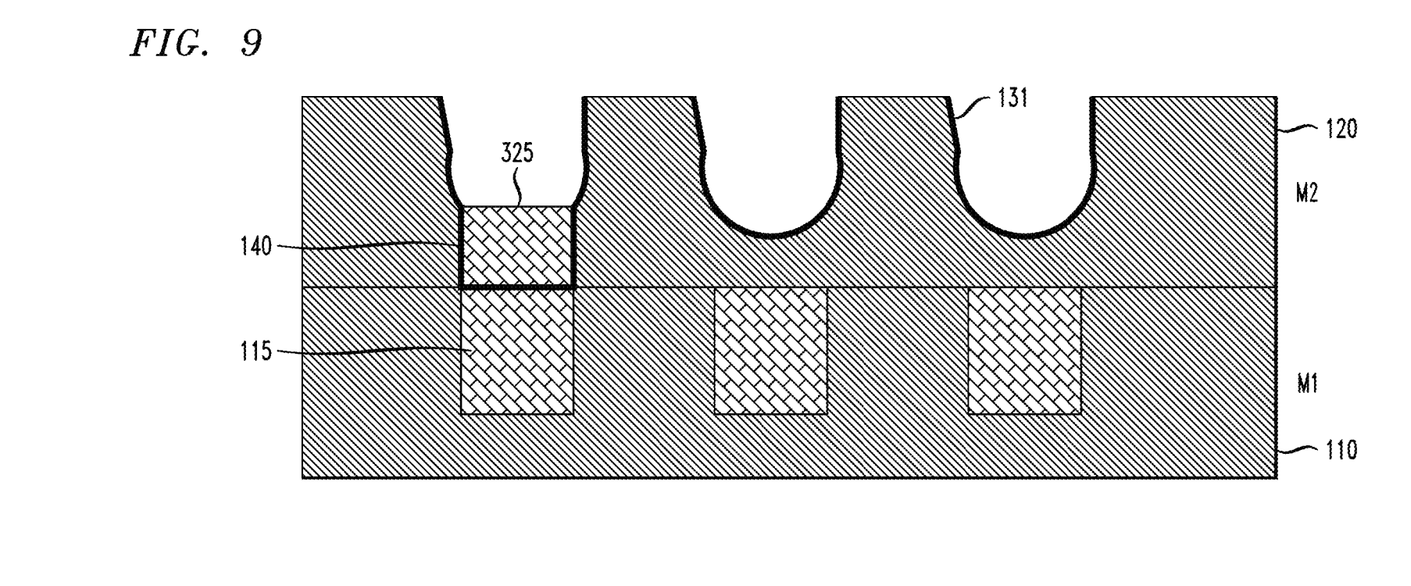
FIG. 9 is a cross-sectional view illustrating fabrication of a semiconductor device at a BEOL or MOL, and showing via prefilling with a metal layer, according to an exemplary embodiment of the present invention.

FIG. 9 is a cross-sectional view illustrating fabrication of a semiconductor device at a BEOL or MOL, and showing via prefilling with a metal layer, according to an exemplary embodiment of the present invention. Referring to FIG. 9, following the formation of trenches and vias, and formation of a liner layer 131 as described herein above in connection with FIG. 1A, one or more vias 140 (other vias (not shown) may be formed similarly to the via 140 in the leftmost trench) are pre-filled with a conductive layer 325, similar to conductive layers 125 and 225 described herein above. The pre-filling is performed using, for example, a selective PVD process, where conductive material, such as, for example, cobalt or copper, is deposited in the via(s) and is grown upward through the height of the via(s). In general, because vias can introduce additional unwanted topography, pre-filling of the one or more vias 140 to form the layer 325 results in a more uniform pattern of the layer 325 than would be formed when using other methods to fill in the vias, such as reflow or electroless plating.

Figure 10:
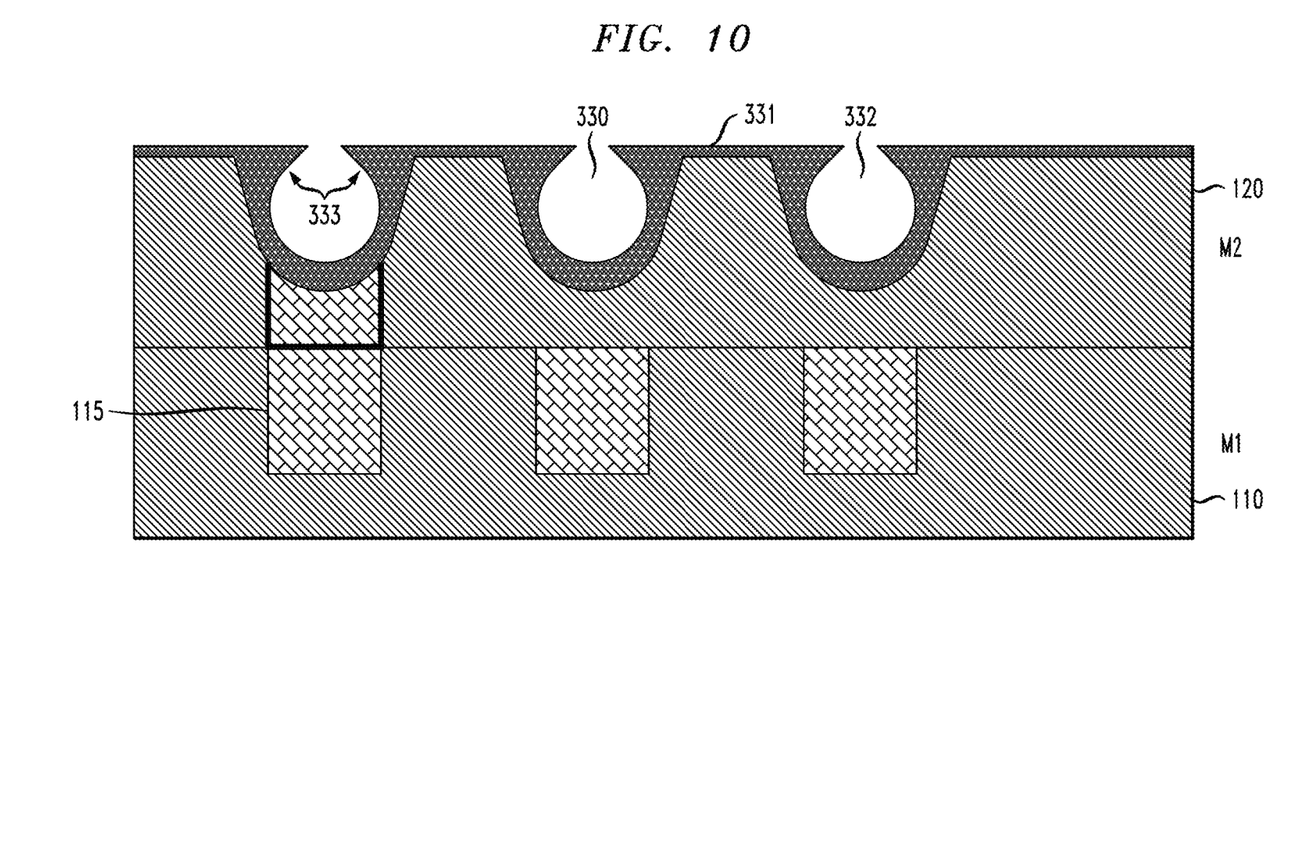
FIG. 10 is a cross-sectional view illustrating fabrication of a semiconductor device at a BEOL or MOL, and showing deposition of a liner layer using a low wafer bias to form an overhang when using via prefilling, according to an exemplary embodiment of the present invention.

FIG. 10 is a cross-sectional view illustrating fabrication of a semiconductor device at a BEOL or MOL, and showing deposition of a liner layer using a low wafer bias to form an overhang when using via prefilling, according to an exemplary embodiment of the present invention. Referring to FIG. 10, following the via pre-filling, a liner material 331, such as, for example, tantalum nitride, is deposited on the dielectric layer 120 and in trenches 330 and on the conductive layer 325 with a low wafer bias to intentionally leave overhanging portions 333, and preserve the rounded bottom shape of the trenches 330. Since the via is already filled as shown in the left trench 330, only the trench filling is performed with the same liner in each of the trenches 330, and thus each trench 330 has a similar rounded structure.

Similar to what is described in connection with FIG. 6, the deposition can be performed using, for example, ALD or PVD since the rounded shape is preserved using low wafer bias. The low wafer bias results in poor step coverage (e.g., more material deposited on top surfaces than on sidewalls and bottom surfaces, forming the overhanging portions 333) of the liner layer 331.

Figure 11:
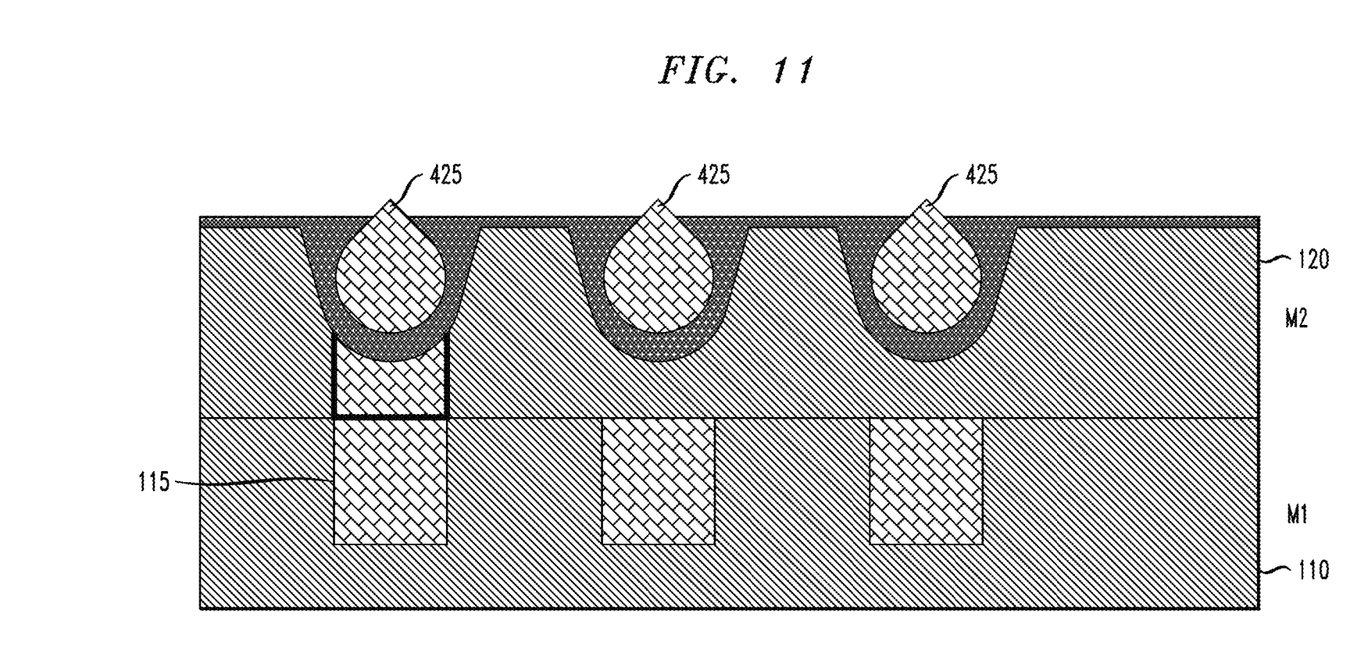
FIG. 11 is a cross-sectional view illustrating fabrication of a semiconductor device at a BEOL or MOL, and showing metal reflow into trenches when using via prefilling, according to an exemplary embodiment of the present invention.
Figure 12:
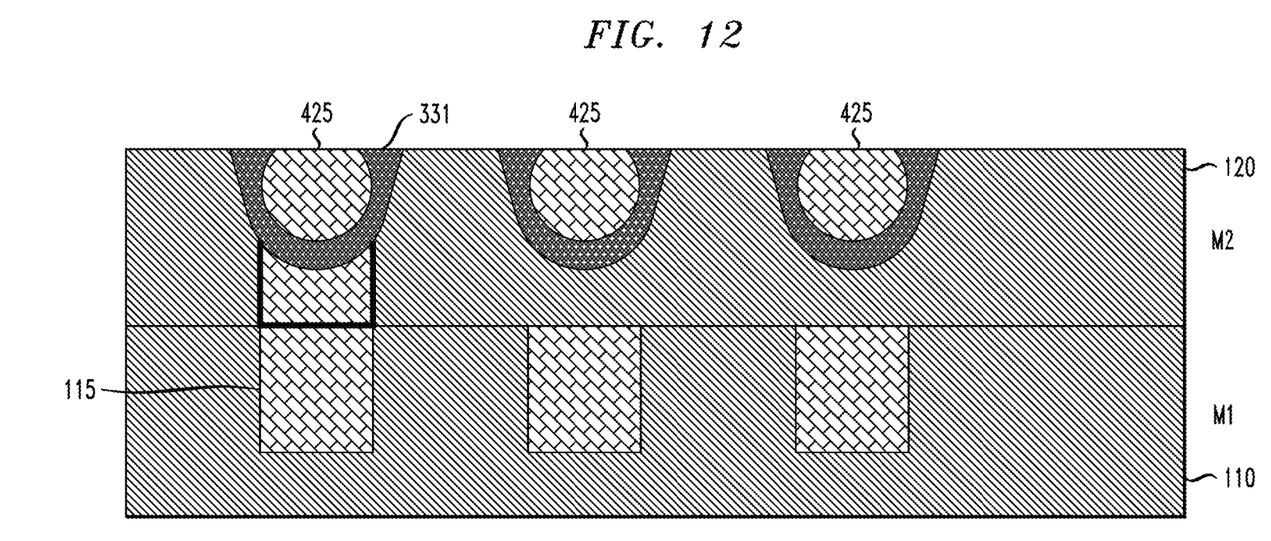
FIG. 12 is a cross-sectional view illustrating fabrication of a semiconductor device at a BEOL or MOL, and showing planarization when using via prefilling, according to an exemplary embodiment of the present invention.

FIGS. 11 and 12 is a cross-sectional view illustrating fabrication of a semiconductor device at a BEOL or MOL, and showing metal reflow into trenches when using via prefilling and planarization, according to an exemplary embodiment of the present invention. Similar to what is described in connection with FIG. 7 (except that the via(s) have been pre-filled), referring to FIG. 11, an electrically conductive layer 425 including, for example, copper (Cu), nickel (Ni), cobalt (Co), iron (Fe), gold (Au), silver (Ag), ruthenium (Ru), palladium (Pd), platinum (Pt), iridium (Ir), tungsten (W), and any mixtures or alloys thereof is deposited on the liner layer 331 and in the trenches 330 using a reflow deposition technique, where the layer 425 is deposited at an elevated temperature, so that the material of the layer 425 flows through the small openings 332 at the top of the trenches 330 caused by the overhanging portions 333. Due to the small openings 332, deposition by plating of the layer 425 is not effective to deposit the layer 425 through the openings 332 and fill in the trenches 330. Instead, capillary action during a reflow process permits the layer 425 to flow through the openings 332 into the trenches 330.

The conductive layer 425 is formed on the liner layer 331 and fills in the trenches 330. The conductive layer 425 may also be formed on the upper surface of the dielectric 120 and the deposited liner layer 331 to a height above the top surface of the dielectric 120 similar to what is shown in FIG. 7, or formed to a point where the conductive layer 425 extends out of the trenches 330 through the openings 332 as shown in FIG. 11. Referring to FIG. 12, the excess conductive layer 425 extending out of the trenches 330 through the openings 332, and the excess liner layer 331 formed on the top surface of the dielectric 120 are polished off, using for example, a CMP process to planarize the top surface and result in structure shown in FIG. 12. As can be seen, similar to what is described in connection with FIG. 8, due to the overhanging portions 333, the resulting top portions of the layer 425 in the trenches 330 have a rounded shape. As a result, processing to remove portions of the conductive layer to form the rounded top portions as described in connection with FIG. 3A may be eliminated or reduced since the round shape or majority of the round shape has already been formed due to the overhanging portions 333. The resulting metal lines formed from the metal and liner layers 425, 331 are cylindrical in shape, and as shown, have a circular or oval cross-section.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:

forming a plurality of trenches in a dielectric layer, wherein the plurality of trenches each comprise a first portion having a rounded surface, and a second portion having linear surfaces;

depositing a liner layer on the rounded surface and on the linear surfaces of each of the plurality of trenches; and depositing a conductive layer on the liner layer in each of the plurality of trenches, wherein the conductive layer and the liner layer form a plurality of interconnects, and each of the plurality of interconnects has a cylindrical shape;

wherein a thickness of a first part of the liner layer on the first portion is less than a thickness of a second part of the liner layer on part of the second portion.

2. The method according to claim 1, wherein the second part of the liner layer comprises a plurality of overhanging portions on upper portions of the linear surfaces of each of the plurality of trenches.

3. The method according to claim 2, wherein an exposed surface of the second part of the liner layer on the upper portions of the linear surfaces of each of the plurality of trenches is formed in a rounded shape by the plurality of overhanging portions.

4. The method according to claim 3, wherein a portion of the conductive layer is formed on the exposed surface of the second part of the liner layer on the upper portions of the linear surfaces of each of the plurality of trenches.

5. The method according to claim 4, wherein the portion of the conductive layer formed on the exposed surface of the second part of the liner layer on the upper portions of the linear surfaces of each of the plurality of trenches has a rounded shape.

6. The method according to claim 4, wherein:
portions of the liner layer and the conductive layer extend beyond a top surface of the dielectric layer; and
the method further comprises performing a planarization process on the dielectric layer to remove portions of the liner layer and the conductive layer extending beyond the top surface of the dielectric layer.

7. The method according to claim 2, wherein the conductive layer is deposited using a reflow process, and wherein the reflow process is performed at a temperature which permits the conductive layer to flow through one or more openings respectively positioned between two overhanging portions of the plurality of overhanging portions.

8. The method according to claim 1, further comprising selectively pre-filling a via extending from one of the plurality of trenches with a material of the conductive layer prior to depositing the conductive layer.

9. A method for manufacturing a semiconductor device, comprising:

forming a trench in a dielectric layer, wherein the trench comprises a first portion having a rounded surface, and a second portion having linear surfaces; and forming a conductive structure in the trench, wherein forming the conductive structure comprises:
depositing a liner layer on the rounded surface and on the linear surfaces of the trench; and
depositing a conductive layer on the liner layer the trench, wherein the conductive layer and the liner layer form the conductive structure, and the conductive structure has a cylindrical shape;
wherein a thickness of a first part of the liner layer on the first portion is less than a thickness of a second part of the liner layer on part of the second portion.

10. The method according to claim 9, wherein the second part of the liner layer comprises a plurality of overhanging portions on upper portions of the linear surfaces of the trench.

11. The method according to claim 10, wherein an exposed surface of the second part of the liner layer on the upper portions of the linear surfaces of the trench is formed in a rounded shape by the plurality of overhanging portions.

12. The method according to claim 11, wherein a portion of the conductive layer is formed on the exposed surface of the second part of the liner layer on the upper portions of the linear surfaces of the trench.

13. The method according to claim 12, wherein the portion of the conductive layer formed on the exposed surface of the second part of the liner layer on the upper portions of the linear surfaces of the trench has a rounded shape.

14. The method according to claim 12, wherein:
portions of the liner layer and the conductive layer extend beyond a top surface of the dielectric layer; and
the method further comprises performing a planarization process on the dielectric layer to remove portions of the liner layer and the conductive layer extending beyond the top surface of the dielectric layer.

15. The method according to claim 10, wherein the conductive layer is deposited using a reflow process, and wherein the reflow process is performed at a temperature which permits the conductive layer to flow through an opening positioned between the plurality of overhanging portions.

16. The method according to claim 9, further comprising selectively pre-filling a via extending from the trench with a material of the conductive layer prior to depositing the conductive layer.

17. A method for manufacturing a semiconductor device, comprising:
forming a trench in a dielectric layer, wherein the trench comprises a rounded surface and linear surfaces; and
forming a conductive structure in the trench, wherein forming the conductive structure comprises:
depositing a liner layer on the rounded surface and on the linear surfaces of the trench, wherein part of the liner layer is formed into a plurality of overhanging portions on upper portions of the linear surfaces of the trench; and
depositing a conductive layer on the liner layer the trench, wherein the conductive layer and the liner layer form the conductive structure, and the conductive structure has a cylindrical shape;
wherein a thickness of the liner layer on the rounded surface is less than a thickness of the part of the liner layer formed into the plurality of overhanging portions.

18. The method according to claim 17, wherein an exposed surface of the liner layer on the upper portions of the linear surfaces of the trench is formed in a rounded shape by the plurality of overhanging portions.

19. The method according to claim 18, wherein a portion of the conductive layer is formed on the exposed surface of the liner layer on the upper portions of the linear surfaces of the trench.

20. The method according to claim 19, wherein the portion of the conductive layer formed on the exposed surface of the liner layer on the upper portions of the linear surfaces of the trench has a rounded shape.

* * * * *